(12) United States Patent
Sekiya et al.

(10) Patent No.: US 6,726,526 B2
(45) Date of Patent: Apr. 27, 2004

(54) CUTTING MACHINE

(75) Inventors: Kazuma Sekiya, Tokyo (JP); Naoki Ohmiya, Tokyo (JP)

(73) Assignee: Disco Corporation, Tokyo (JP)

( * ) Notice: Subject to any disclaimer, the term of this patent is extended or adjusted under 35 U.S.C. 154(b) by 5 days.

(21) Appl. No.: 10/145,893

(22) Filed: May 16, 2002

(65) Prior Publication Data

US 2002/0179079 A1 Dec. 5, 2002

(30) Foreign Application Priority Data

May 30, 2001 (JP) ........................................ 2001-162958

(51) Int. Cl.[7] .............................................. B24B 49/00
(52) U.S. Cl. ............................... 451/5; 451/65; 451/67; 125/13.01
(58) Field of Search ............................... 451/5, 67, 65; 125/13.01, 14, 23.01; 83/425.2

(56) References Cited

U.S. PATENT DOCUMENTS

| | | | | |
|---|---|---|---|---|
| 6,102,023 A | * | 8/2000 | Ishiwata et al. | ......... 125/13.01 |
| 6,216,682 B1 | * | 4/2001 | Nambu et al. | ........... 125/13.01 |
| 6,325,057 B1 | * | 12/2001 | Farnworth | .................... 125/12 |
| 6,345,616 B1 | * | 2/2002 | Umahashi | ................ 125/13.01 |
| 6,346,034 B1 | * | 2/2002 | Leng | ............................ 451/58 |
| 6,527,627 B2 | * | 3/2003 | Arai | ............................ 451/41 |
| 2001/0007253 A1 | * | 7/2001 | Saito | ........................ 125/13.01 |

FOREIGN PATENT DOCUMENTS

JP          2-261607     * 10/1990

* cited by examiner

*Primary Examiner*—M. Rachuba
(74) *Attorney, Agent, or Firm*—Smith, Gambrell & Russell, LLP

(57) ABSTRACT

A cutting machine includes two cutting means. In a front half of a housing, a chucking zone is located in a widthwise center. A cassette placing zone is located on one side of the chucking zone, and a cleaning zone is located on the other side of the chucking zone. In a latter half of the housing, a cutting zone is disposed in a widthwise center. Rotating shafts of the two cutting means extend straightly in a width direction in the rear half of the housing.

4 Claims, 3 Drawing Sheets

CUTTING MACHINE

FIELD OF THE INVENTION

This invention relates to a cutting machine particularly suitable for dicing a semiconductor wafer. More specifically, the invention relates to a cutting machine of the type having two cutting means whose rotating shafts are arranged on a straight line and whose rotating blades are mounted on the inner ends of the rotating shafts and are opposed to each other.

DESCRIPTION OF THE PRIOR ART

Japanese Unexamined Patent Publication No. 2001-7058 discloses a cutting machine including two cutting means and particularly suitable for dicing a semiconductor wafer with a high efficiency. Such a cutting machine has a housing slenderly extending in a fore-and-aft direction, and an operating panel is disposed on a front surface of the housing. On one side of the housing, a cassette-placing zone, a chucking zone, and a cleaning zone are arranged sequentially in a rearward direction. A cutting zone is disposed at the center in the fore-and-aft direction on the other side of the housing. Cassette supporting means is disposed in the cassette placing zone, and cleaning means is disposed in the cleaning zone. Two cutting means, i.e., first cutting means and second cutting means, are disposed on the other side of the housing. The first cutting means has a first rotating shaft and a cutting blade mounted on the first rotating shaft. The second cutting means has a second rotating shaft and a cutting blade mounted on the second rotating shaft. The first rotating shaft and the second rotating shaft extend on a straight line in the fore-and-aft direction on the other side of the housing. The first cutting blade and the second cutting blade are mounted on the inner end, i.e., the rear end, of the first rotating shaft, and the inner end, i.e., the front end, of the second rotating shaft, respectively, and located opposite each other.

A cassette accommodating a plurality of workpieces, optionally a plurality of semiconductor wafers, is placed on the cassette supporting means, and the workpieces accommodated in the cassette are sequentially delivered to the chucking zone. The delivered workpiece is chucked onto the chuck means, and conveyed to the cutting zone together with the chuck means. In the cutting zone, the workpiece is cut by the first cutting blade and the second cutting blade. Then, the workpiece is returned to the chucking zone together with the chuck means, and transported from the chucking zone to the cleaning zone. In the cleaning zone, the workpiece is cleaned, then transported to the chucking zone, and then brought into the cassette.

The above-described cutting machine disclosed in Japanese Unexamined Patent Publication No. 2001-7058 is made compact, by skillful arrangement of the various zones, in comparison with other types of cutting machines including two cutting means, for example, the cutting machines disclosed in Japanese Unexamined Patent Publication Nos. 1999-26402 and 1999-74228. However, this cutting machine is still unsatisfactory, and poses the following problems: The cutting blades in the two cutting means wear upon execution of cutting, and need replacement. However, there is considerable distance from the front of the housing to the position of mounting of the cutting blade. Thus, it is very difficult, if not impossible, to perform an operation for replacing the cutting blade from the front of the housing. Usually, an operator has to be situated on the side of the housing in order to carry out the operation for replacing the cutting blade. This makes the replacement operation relatively complicated. To enable the operator to be situated on the side of the housing during replacement of the cutting blade, there is need to secure a required space near the side of the housing. Thus, a relatively large space is required for installing the cutting machine. In using the cutting machine for cutting a semiconductor wafer, it is necessary to install the cutting machine in a so-called clean room. In this sense, the necessity for the relatively large space for installation of the cutting machine is not a negligible problem.

SUMMARY OF THE INVENTION

A principal object of the present invention is to improve the layout of various zones in a cutting machine of the type having two cutting means, facilitate an operation for replacement of a cutting blade, and reduce a space necessary for installation of the cutting machine.

The inventors of the present invention conducted in-depth studies, and have found that the above object can be attained by arranging a chucking zone in a widthwise center, a cassette placing zone on one side of the chucking zone, and a cleaning zone on the other side of the chucking zone in a front half of a housing, arranging a cutting zone in a widthwise center in a rear half of the housing, and designing rotating shafts of two cutting means to extend straightly widthwise in the rear half of the housing.

According the present invention, there is provided a cutting machine comprising:

a housing having an operating panel disposed on a front surface thereof; and wherein a chucking zone located in a widthwise center, a cassette placing zone located on one side of the chucking zone, and a cleaning zone located on an opposite side of the chucking zone are arranged in a front half of the housing, while a cutting zone located in the widthwise center is arranged in a rear half of the housing;

cassette supporting means is disposed in the cassette placing zone, and cleaning means is disposed in the cleaning zone;

chuck means is disposed so as to be movable in a fore-and-aft direction between the chucking zone and the cutting zone;

first cutting means and second cutting means are disposed in the rear half of the housing, the first cutting means has a first rotating shaft and a first cutting blade mounted on the first rotating shaft, the second cutting means has a second rotating shaft and a second cutting blade mounted on the second rotating shaft, the first rotating shaft and the second rotating shaft extend straightly in a width direction in the rear half of the housing, and the first cutting blade and the second cutting blade are mounted on a widthwise inner end of the first rotating shaft and a widthwise inner end of the second rotating shaft, respectively, and located opposite each other; and a cassette accommodating a plurality of workpieces is placed on the cassette supporting means, the workpieces accommodated in the cassette are sequentially delivered to the chucking zone, the delivered workpiece is chucked onto the chuck means in the chucking zone, and conveyed to the cutting zone together with the chuck means, and the workpiece on the chuck means is cut by the first cutting blade and the second cutting blade in the cutting zone, then returned to the chucking zone together with the chuck means, transported from the chucking zone to the cleaning zone, cleaned in the cleaning zone, then transported to the chucking zone, and brought into the cassette.

Preferably, temporary support means is disposed in the chucking zone, and the workpiece delivered from the cassette to the chucking zone is first placed on the temporary support means, then transported from a site on the temporary support means to a site on the chuck means, cut, cleaned, and transported from the cleaning zone to the chucking zone, whereafter the workpiece is placed onto the temporary support means, and brought into the cassette. Preferably, the temporary support means is composed of a pair of support members, and the pair of support members are free to move between an operating position, where the support members are located at a predetermined spacing relative to each other and the workpiece is placed across the support members, and a non-operating position where the support members are moved from the operating position away from each other to allow the workpiece to descend through a gap therebetween, and when the chuck means is located in the chucking zone, the chuck means is positioned below the temporary support means. In preferred embodiments, the workpiece is a semiconductor wafer, and the first cutting blade and the second cutting blade are shaped as disks containing diamond grains and dice the semiconductor wafer.

DETAILED DESCRIPTION OF THE PREFERRED EMBODIMENTS

The present invention will be described in further detail by reference to the accompanying drawings showing preferred embodiments of a cutting machine constructed in accordance with the invention.

Figure 1:
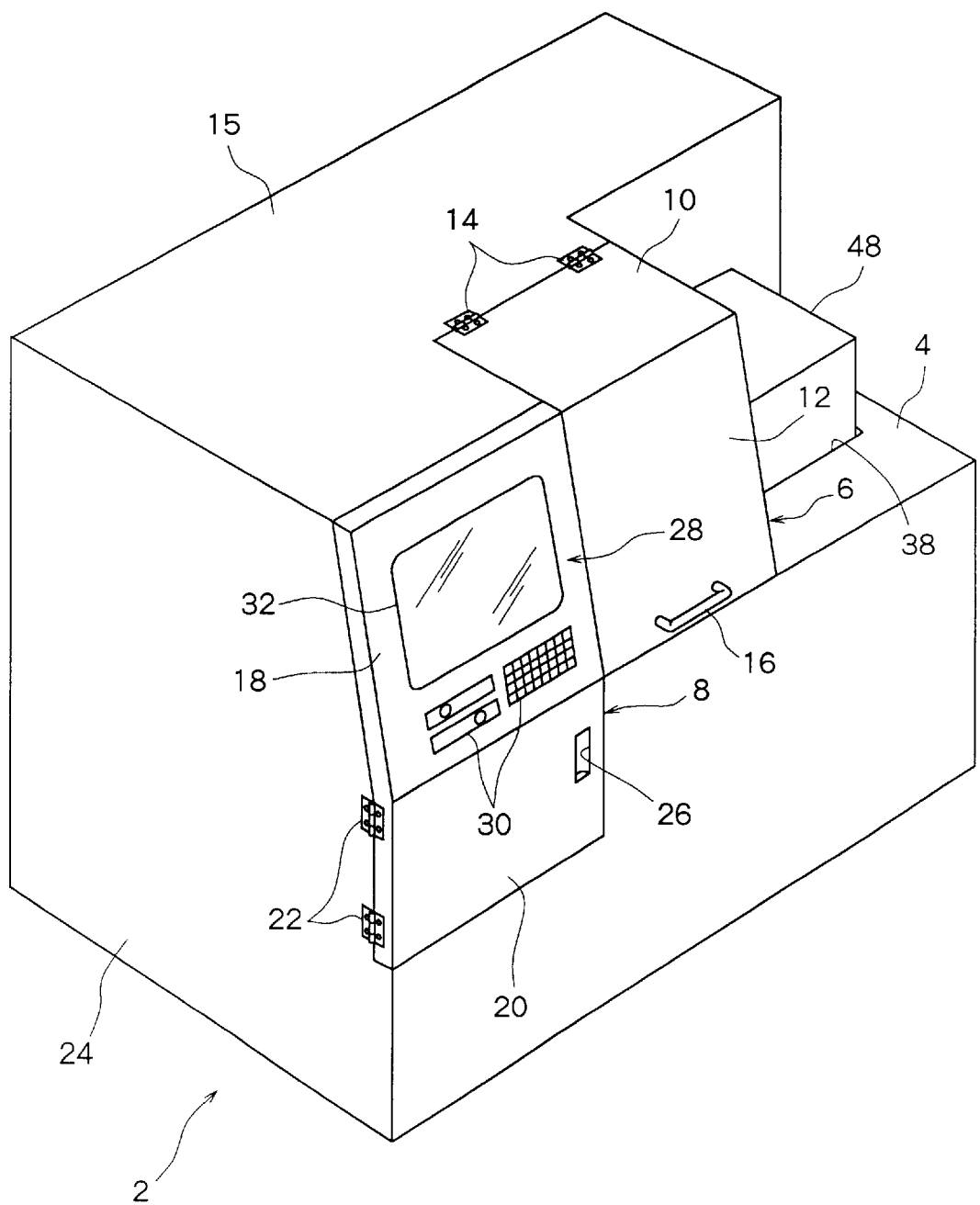
FIG. 1 is a perspective view showing a preferred embodiment of a cutting machine constructed in accordance with the present invention.

With reference to FIG. 1, the illustrated cutting machine has a housing entirely indicated at 2. The housing 2 is in the form of a nearly rectangular parallelopiped, whose former, upper half and right-hand portion, when viewed from the front, has a relatively large depressed portion 4 of a nearly rectangular parallelopiped. An opening (not shown) is formed in a left surface of the depressed portion 4, and the depressed portion 4 communicates with the interior of the housing 2 through the opening. Two open/close doors 6 and 8 are disposed at the front of the housing 2. The open/close door 6 has a top plate portion 10 defining a widthwise center of the front half of an upper surface of the housing 2, and a front plate portion 12 extending downward from the front end of the top plate portion in a somewhat forwardly inclined manner. A rear edge of the top plate portion 10 of the open/close door 6 is pivotally mounted on a stationary top plate 15 of the housing 2 via hinge means 14, and a grip 16 is disposed in a lower part of the front plate portion 12. When the grip 16 is grasped and the open/close door 6 is pivoted upward about the hinge means 14 as a pivot center, an upper half central region in the front of the housing 2 is exposed to permit access to the interior of the housing 2. The open/close door 8 is disposed in a left-hand part at the front of the housing 2, and has an inclined upper portion 18 extending downward from the top surface of the housing 2 in a somewhat forwardly inclined manner, and a lower portion 20 extending downward from the inclined upper portion 18 substantially vertically. The left edge of the open/close door 8 is pivotally mounted on a stationary left side plate 24 of the housing 2 via hinge means 22, and a grip 26 is disposed in a right edge portion of the open/close door 8. When a hand is hooked on the grip 26 and the open/close door 8 is pivoted leftward about the hinge means 22, a left-hand region of the front of the housing 2 is exposed to permit access to the interior of the housing 2. An operating panel 28 is disposed in the inclined upper portion 18 of the open/close door 8. The operating panel 28 includes various operating keys or buttons 30 and a so-called touch panel 32.

Figure 2:
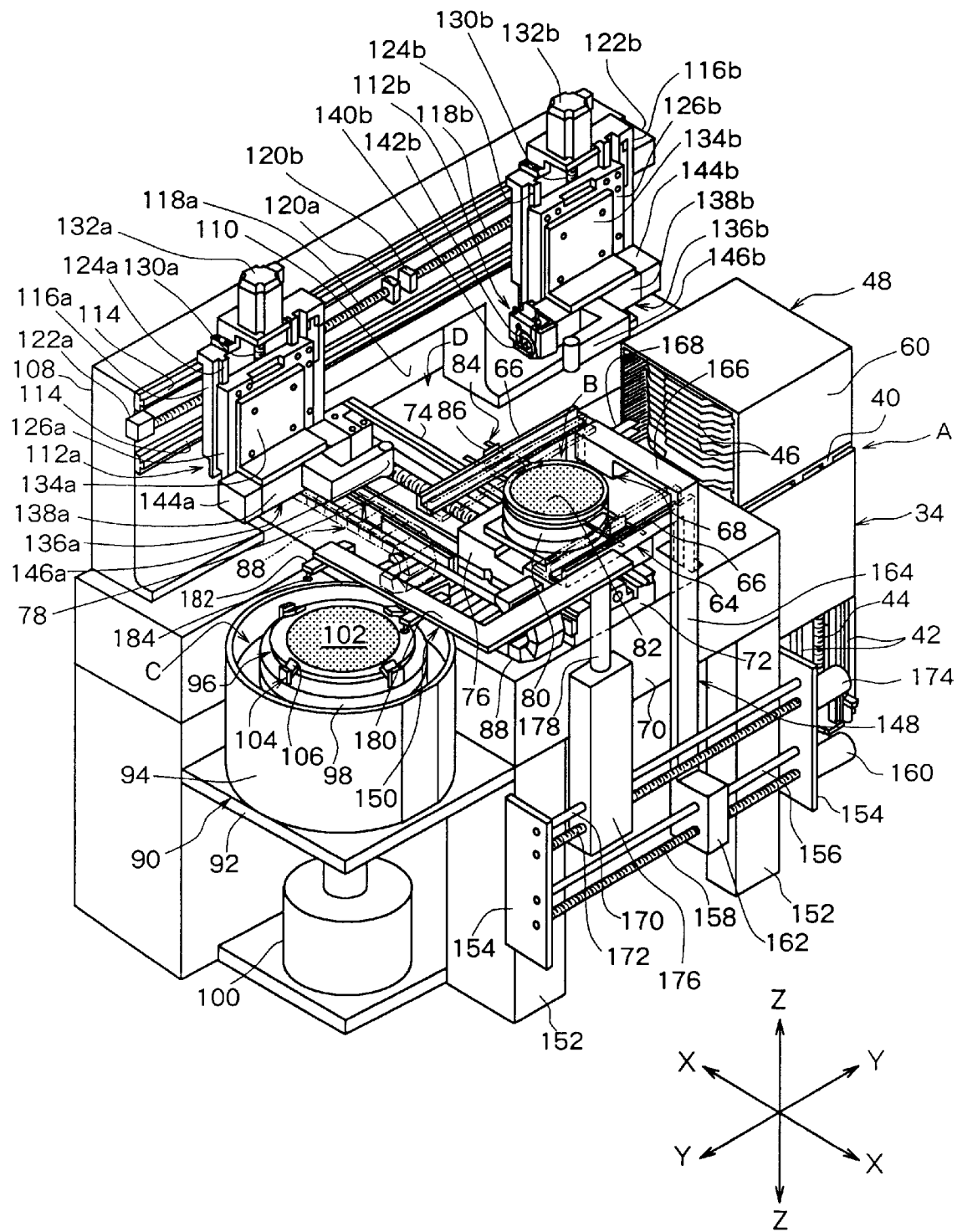
FIG. 2 is a perspective view showing the cutting machine of FIG. 1, with a housing wall, etc. being omitted to illustrate the internal structure of the cutting machine.

With reference to FIG. 2 along with FIG. 1, a cassette placing zone A is disposed in the depressed portion 4 of the housing 2. A chucking zone B, a cleaning zone C, and a cutting zone D are arranged within the housing 2. Not only the cassette placing zone A, but also the chucking zone B and the cleaning zone C are arranged in the front half of the housing 2. The chucking zone B is located in the widthwise center, the cassette placing zone A is located to the right of the chucking zone B, and the cleaning zone C is located to the left of the chucking zone B. The cutting zone D is located in the widthwise center of the rear half of the housing 2. Herein, a fore-and-aft direction is designated as an X-axis direction, a width direction as a Y-axis direction, and an up-and-down direction as a Z-axis direction for convenience of explanation. Preferably, the cleaning zone C, the chucking zone B, and the cassette placing zone A are arranged substantially on a straight line in the Y-axis direction. Preferably, the chucking zone B and the cutting zone D are arranged substantially on a straight line in the X-axis direction.

Cassette supporting means 34 is disposed in the cassette placing zone A. The cassette supporting means 34, which may be of a well known form per se, has an elevating platform 40 to be moved up and down through an opening 38 (FIG. 1) formed in an upper wall 36 of the depressed portion 4 of the housing 2. As shown in FIG. 2, two guide rails 42 extending substantially vertically are fixed within the housing 2, and guided grooves (not shown) are formed in the elevating platform 40. By slidably engaging the guided grooves of the elevating platform 40 with the guide rails 42, the elevating platform 40 is mounted so as to be upwardly and downwardly movable along the guide rails 42. An externally threaded shaft 44 extending substantially vertically is rotatably mounted within the housing 2, and an internally threaded member (not shown) screwed on the externally threaded shaft 44 is fixed to the elevating platform 40. An electric motor (not shown) is connected to the externally threaded shaft 44, and the externally threaded shaft 44 is rotated normally and reversely by the electric motor to raise and lower the elevating platform 40.

Figure 3:
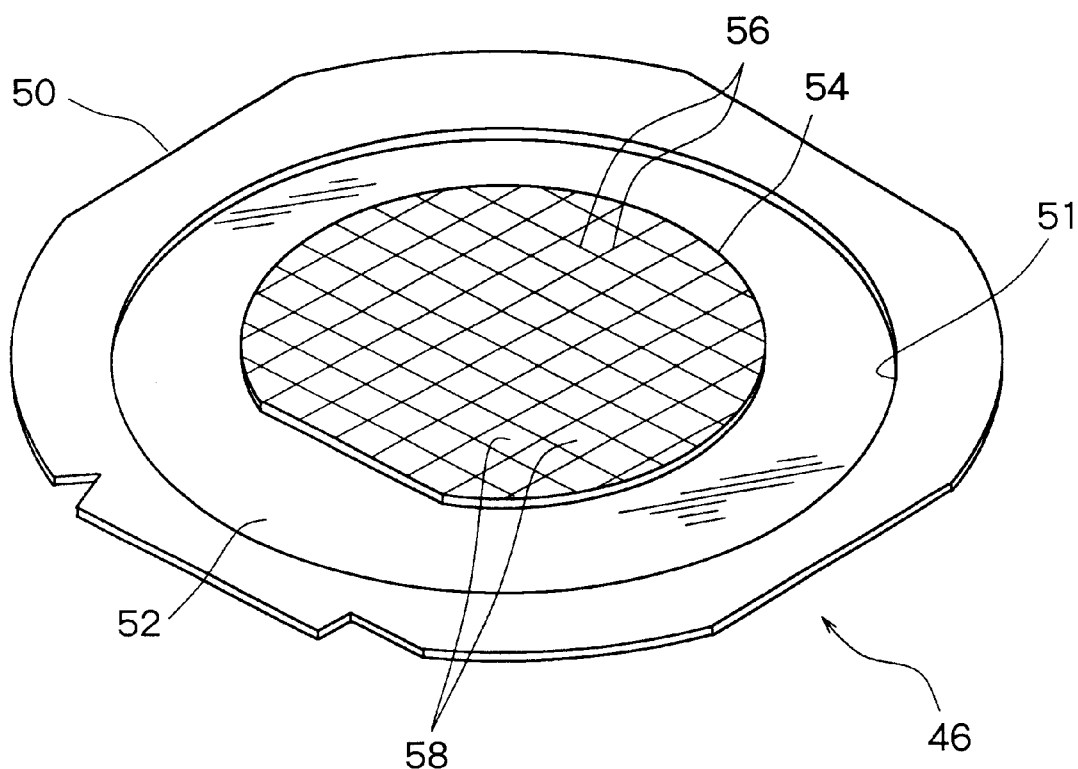
FIG. 3 is a perspective view showing a workpiece (a semiconductor wafer mounted to a frame via a mounting tape) to be cut by the cutting machine of FIG. 1.

A cassette 48 accommodating a plurality of workpieces 46 is placed on the elevating platform 40 of the cassette supporting means 34. The workpiece 46 in the illustrated embodiment, as shown in FIG. 3, comprises a semiconductor wafer 54 mounted on a frame 50 via a mounting tape 52, the frame 50 having a mounting opening 51 formed in the center. The mounting tape 52 extends so as to bridge the mounting opening 51 of the frame 50, and is bonded to the back surface of the frame 50. The semiconductor wafer 54 located within the mounting opening 51 of the frame 50 has a back bonded to the mounting tape 52. Cutting lines or streets 56 arranged in a lattice pattern are formed on the face of the semiconductor wafer 54, and an electronic circuit is formed in each of rectangular areas 58 demarcated by the streets 56. The cassette 48 has a pair of side walls 60, and a plurality of accommodation grooves extending horizontally with predetermined spacing in the up-and-down direction are formed on the inner surfaces of the side walls 60. The workpieces 46 each have opposite side edge portions of the frame 50 inserted into the accommodation grooves paired for the pair of side walls 60, whereby the workpieces 46 are accommodated in a substantially horizontally extending state with predetermined spacing in the up-and-down direction. A front surface of the cassette 48, namely, a left-hand surface of the cassette 48 when viewed from the front of the housing 2, is open. Upon ascent or descent of the elevating platform 40, each pair of the accommodation grooves of the cassette 48 is located at a predetermined height. As will be further stated later, the workpiece 46 to be cut is delivered from the each pair of accommodation grooves located at the predetermined height, is then cut, and cleaned. The so treated workpiece 46 is admitted into the pair of accommodation grooves located at the predetermined height.

As will be clearly shown in FIG. 2, temporary support means 64 is disposed in the chucking zone B. The temporary support means 64 includes a pair of support members 66 disposed with spacing in the X-axis direction. The pair of support members 66 are mounted movably in the X-axis direction, and selectively brought to a non-operating position indicated by solid lines and an operating position indicated by two-dot chain lines in FIG. 2. As will be further mentioned later, when the pair of support members 66 are located at the operating position, the workpiece 46 delivered from the cassette 48 is placed across the pair of support members 66 (in other words, opposite side edge portions of the frame 50 in the workpiece 46 are supported by the pair of support members 66). When the pair of support members 66 are moved to the non-operating position and separated from each other, it becomes possible to raise or lower the workpiece 46 through the space between the pair of support members 66.

With reference to FIG. 2, chuck means 68 is disposed within the housing 2 so as to be substantially horizontally movable in the X-axis direction between the chucking zone B and the cutting zone D. In detail, a stationary support pedestal 70 extending substantially horizontally is disposed within the housing 2, and a pair of support blocks 72 (only one of them is shown in FIG. 2) are fixed onto the support pedestal 70 with spacing in the X-axis direction. A pair of guide rails 74, which extend in the X-axis direction with spacing in the Y-axis direction, are fixed between the pair of support blocks 72. A slide block 76 is mounted on the pair of guide rails 74. A pair of guided grooves extending in the X-axis direction are formed in a lower surface of the slide block 76. By engaging the pair of guided grooves with the pair of guide rails 74, the slide block 76 is mounted so as to be movable along the guide rails 74 in the X-axis direction. An externally threaded shaft 78 extending in the X-axis direction is rotatably mounted between the pair of support blocks 72. An internally threaded member (not shown) is fixed to a lower surface of the slide block 76, and the internally threaded member is screwed to the externally threaded shaft 78. An electric motor (not shown) is connected to the externally threaded shaft 78, and the electric motor is rotated normally and reversely to move the slide block 76 along the guide rails 74 in the X-axis direction. A cylindrical support member 80 is fixed to the slide block 76, and a chuck member 82 is mounted on the support member 80 so as to be rotatable about a central axis extending substantially vertically. A rotational drive source (not shown), optionally an electric motor, for rotating the chuck member 82 is disposed within the support member 80. The chuck member 82 in the shape of a disk is formed from a porous material such as porous ceramic. The chuck member 82 is equipped with a pair of grip mechanisms 84 protruding in the X-axis direction. Each of the grip mechanisms 84 includes a movable grip piece 86, and the movable grip pieces 86 are selectively brought by actuation means (not shown), such as a pneumatic actuator, to a non-gripping position shown in FIG. 2, and a gripping position to which the movable grip pieces are pivoted inwardly from the non-gripping position. When the chuck means 68 is located in the chucking zone B as shown in FIG. 2, the chuck member 82 is situated between the pair of support members 66 of the temporary support means 64 in the X-axis direction, and below the pair of support members 66 of the temporary support means 64 in the Z-axis direction. The slide block 76 is equipped with a hollow protective duct 88, which is suitably deformed from a state indicated by solid lines into a state indicated by two-dot chain lines in FIG. 2, and vice versa, as the slide block 76 is moved. The chuck member 82 formed from a porous material is selectively brought into communication with a suitable suction source (not shown) via a suction passage (not shown) disposed within the support member 80, slide block 76 and hollow protective duct 88. Electrical wiring for the actuation means, which moves the movable grip pieces 86 of the grip mechanisms 84, also extends within the support member 80, slide block 76 and hollow protective duct 88.

Cleaning means 90 is disposed in the cleaning zone C. As clearly shown in FIG. 2, the cleaning means 90, which may have a well known form per se, includes a cylindrical partition wall 94 fixed onto a stationary support plate 92, and a chucking mechanism 96 rotatably disposed inside the partition wall 94. The chucking mechanism 96 includes an elevating platform 98 to be moved up and down between an ascent position indicated in FIG. 2 and a descent position made lower than the ascent position by a predetermined amount. The elevating platform 98 is connected to a piston of a pneumatic cylinder mechanism 100 disposed substantially vertically, and is raised and lowered by the action of the pneumatic cylinder mechanism 100. At an upper end of the elevating platform 98, a chuck member 102 of a disk shape is disposed rotatably about a central axis extending substantially vertically. The chuck member 102 is formed from a porous material, such as porous ceramic, and is selectively brought into communication with a suitable suction source (not shown) via a suction passage (not shown) disposed within the elevating platform 98. Four grip mechanisms 104 are disposed around the chuck member 102. Each of the grip mechanisms 104 includes a movable grip piece 106, and the movable grip piece 106 is selectively brought by actuation means (not shown), such as an electromagnetic solenoid, to a non-gripping position shown in FIG. 2, and a gripping position to which the movable grip piece 106 is pivoted inwardly from the non-gripping position. An electric motor (not shown) for rotating the chuck member 102 and the grip mechanisms 104 provided thereon is disposed within the elevating platform 98. The cleaning means 90 further includes a jet nozzle (not shown) for jetting a cleaning liquid which may be pure water. As will be further mentioned later, the chuck member 102 and the grip mechanisms 104, which are holding the workpiece 46, are rotated at a high speed during cleaning, and the cleaning liquid is jetted from the jet nozzle against the workpiece 46 placed on the chuck member 102.

Referring to FIG. 2, an upright support base plate 108 extending in the Y-axis direction is fixed onto the support pedestal 70. A relatively large notch 110 for accepting the chuck member 82 is formed in the center of the support base plate 108. A pair of cutting means, i.e., first cutting means 112a and second cutting means 112b, are mounted on the support base plate 108. In more detail, a pair of guide rails 114 extending in the Y-axis direction with spacing in the up-and-down direction are disposed on the front surface of the support base plate 108. The first cutting means 112a and the second cutting means 112b include slide blocks 116a and 116b, respectively, and a pair of guided grooves (not shown) extending in the Y-axis direction are formed in each of the rear surfaces of the slide blocks 116a and 116b. By engaging the pair of guided grooves with the pair of guide rails 114, the slide block 116a and the slide block 116b are mounted on the pair of guide rails 114 so as to be slidable in the Y-axis direction. Externally threaded shafts 118a and 118b extending in the Y-axis direction are further mounted rotatably on the front surface of the support base plate 108 via bearing members 120a and 120b. The externally threaded shafts 118a and 118b are arranged on a straight line. Internally threaded members (not shown) are fixed onto the rear surfaces of the slide blocks 116a and 116b, and these internally threaded members are screwed to the externally threaded shafts 118a and 118b. Electric motors 122a and 122b are connected to the externally threaded shafts 118a and 118b. When the externally threaded shafts 118a and 118b are rotated by the electric motors 122a and 122b, the slide blocks 116a and 116b are moved in the Y-axis direction along the pair of guide rails 114. Elevating blocks 126a and 126b are mounted on the slide blocks 116a and 116b, respectively. A pair of guide rails 124a and a pair of guide rails 124b, which extend substantially vertically, namely, in the Z-axis direction with spacing in the Y-axis direction, are disposed on the front surfaces of the slide blocks 116a and 116b, respectively. A pair of guided grooves extending in the Z-axis direction are formed on each of the rear surfaces of the elevating blocks 126a and 126b. By engaging the pair of guided grooves with the pair of guide rails 124a and the pair of guide rails 124b, the elevating blocks 126a and 126b are mounted on the slide blocks 116a and 116b so as to be movable up and down in the Z-axis direction. Externally threaded shafts 130a and 130b extending in the Z-axis direction are rotatably mounted on the slide blocks 116a and 116b, respectively. Internally threaded members (not shown) are fixed onto the rear surfaces of the elevating blocks 126a and 126b, and these internally threaded members are screwed to the externally threaded shafts 130a and 130b, respectively. Electric motors 132a and 132b are connected to the externally threaded shafts 130a and 130b. When the externally threaded shafts 130a and 130b are rotated by the electric motors 132a and 132b, the elevating blocks 126a and 126b are moved up and down along the pair of guide rails 124a and 124b.

Cutting units 136a and 136b are mounted on the elevating blocks 126a and 126b, respectively, via connecting brackets 134a and 134b. The cutting units 136a and 136b include nearly rectangular parallelopipedal cases 138a and 138b, respectively. Rotating shafts extending in the Y-axis direction are mounted rotatably within the cases 138a and 138b (only a rotating shaft 140b mounted in the case 138b is shown in FIG. 2). These rotating shafts extend on a straight line in the width direction. Cutting blades are fixed to the widthwise inner ends of the rotating shafts, namely, their ends opposed to each other (only a cutting blade 142b fixed to the rotating shaft 140b is shown in FIG. 2). The cutting blade can be constituted of a thin disk containing diamond abrasive grains. Electric motors 144a and 144b are connected to the outer ends of the rotating shafts 140a and 140b. The cases 138a and 138b are further equipped with imaging means 146a and 146b including microscopes.

With further reference to FIG. 2, first transport means 148 and second transport means 150 are also disposed in the illustrated cutting machine. The first transport means 148 will be described first. The support pedestal 70 is provided with four support pillars 152 extending downward (anteriorly located two of the four support pillars 152 are shown in FIG. 2), and two forwardly projecting support plates 154 are fixed to the two anteriorly located support pillars 152. A guide rod 156 extending substantially horizontally in the width direction is fixed between the support plates 154 located apart in the width direction, and an externally threaded shaft 158 similarly extending substantially horizontally in the width direction is rotatably mounted therebetween. An electric motor 160 is connected to the externally threaded shaft 158. The first transport means 148 has a slide block 162, and a guided hole for insertion therethrough of the guide rod 156 and an internally threaded hole screwed to the externally threaded shaft 158 are formed in the slide block 162. The slide block 162 has an upright arm portion 164 extending upward substantially vertically, and a horizontal arm portion 166 extending rearward substantially horizontally from the upper end of the upright arm portion 164, and grip means 168 is disposed at the front end of the horizontal arm portion 166. The grip means 168 may be of a well known form having a pair of grip pieces for selectively gripping an edge portion of the frame 50 in the workpiece 46. When the electric motor 160 is energized, the slide block 162 is moved in the width direction, namely, the Y-axis direction, so that the grip means 168 is moved in the Y-axis direction. As will be further mentioned later, the first transport means 148 delivers the workpiece 46 from inside the cassette 48 placed on the cassette supporting means 34 onto the temporary support means 64, and admits the workpiece 46 again from the site on the temporary support means 64 into the cassette 48.

The second transport means 150 will be described next. A guide rod 170 extending substantially horizontally in the width direction is fixed between the support plates 154, and an externally threaded shaft 172 similarly extending substantially horizontally in the width direction is rotatably mounted therebetween. An electric motor 174 is connected to the externally threaded shaft 172. The second transport means 150 has a slide block 176, and a guided hole for insertion therethrough of the guide rod 170 and an internally threaded hole screwed to the externally threaded shaft 172 are formed in the slide block 176. A pneumatic cylinder mechanism having a piston 178 extending upward substantially vertically is disposed in the slide block 176, and a nearly L-shaped arm 180 is fixed to the front end of the piston 178. A pair of support pieces 182 are fixed to a lower surface of a portion of the arm 180 extending in the fore-and-aft direction, and attraction instruments 184 are mounted on the lower surfaces of the support pieces 182. Each of the attraction instruments 184 is selectively brought into communication with a suction source (not shown) via a suitable suction passage (not shown), and thus can attract the frame 50 in the workpiece 46. When the electric motor 174 is energized, the slide block 176 is moved in the width direction, namely, the Y-axis direction, so that the attraction instruments 184 are moved in the Y-axis direction. When the piston 178 of the pneumatic cylinder mechanism is extended or contracted, the attraction instruments 184 are raised or lowered vertically, namely, in the Z-axis direction. As will be further mentioned later, the second transport means 150 transports the workpiece 46 on the chuck member 82 of the chuck means 68 onto the chuck member 102 of the cleaning means 90, or transports the workpiece 46 on the chuck member 102 of the cleaning means 90 onto the temporary support means 64.

The actions of the foregoing cutting machine will be described briefly. The elevating platform 40 of the cassette supporting means 34 is raised (or lowered) to a required height, whereby specific one of the plural workpieces 46 accommodated in the cassette 48 placed on the elevating platform 40 is located at a predetermined height. In this state, the first transport means 148 is actuated, whereupon the grip means 168 grips the frame 50 in the specific one workpiece 46 within the cassette 48, transports the workpiece 46 from the cassette placing zone A to the chucking zone B, and locates the workpiece 46 onto the temporary support means 64 in the chucking zone B. Then, the grip means 168 of the first transport means 148 is released from the workpiece 46, and the first transport means 148 is moved to a wait position nearer to the cleaning zone C than to the chucking zone B. At this time, the second transport means 150 is moved in the Y-axis direction up to the chucking zone B, and lowered in the chucking zone B to lower the attraction instruments 184 until they are brought into intimate contact with the frame 50 of the workpiece 46. Then, the attraction instruments 184 are brought into communication with the suction source to attract the workpiece 46. Then, the pair of support members 66 of the temporary support means 64 are moved to the non-operating position indicated by the solid lines, and retracted from below the workpiece 46. Then, the attraction instructions 184 of the second transport means 150 are lowered, and the workpiece 46 attracted to the attraction instruments 184 is located onto the chuck member 82 of the chuck means 68. The chuck member 82 is brought into communication with the suction source, whereby the semiconductor wafer 54 in the workpiece 46 is attracted onto the chuck member 82. The movable grip pieces 86 of the pair of grip mechanisms 84 provided in the chuck member 82 are brought to the grip position, gripping the frame 50. The attraction instruments 184 of the second transport means 150 are cut off from the suction source to release the workpiece 46, and are then raised.

Then, the chuck means 68 is moved rearward over a required distance, and the microscopes of the imaging means 146a and 146b provided in the first cutting means 112a and the second cutting means 112b are located at a position facing the face of the semiconductor wafer 54 laid on the chuck member 82. Thus, the image on the face of the semiconductor wafer 54 is photographed. Based on the photograph, the semiconductor wafer 54 on the chuck member 82 is fully precisely aligned with the cutting blade (not shown) of the first cutting means 112a and the cutting blade 142b of the second cutting means 112b. During this alignment, the chuck member 82 is moved in the X-axis direction, and rotated about the central axis, as desired. Then, the chuck means 68 is moved further rearward and positioned in the cutting zone D, where the semiconductor wafer 54 attracted onto the chuck member 82 is subjected to cutting or dicing. During this dicing, the chuck member 82 is moved in the X-axis direction, and the cutting blade of the first cutting means 112a and the cutting blade 142b of the second cutting means 112b act on the semiconductor wafer 54 simultaneously or with some time difference to cut the semiconductor wafer 54 along the streets 56 extending in the X-axis direction. The cutting unit 136a of the first cutting means 112a and the cutting unit 136b of the second cutting means 112b are located at a required height, and indexed periodically in the Y-axis direction. When cutting along the streets 56 extending in the X-axis direction is completed, the chuck member 82 is rotated 90°, and cutting is newly begun along the streets 56 located in a state extending in the Y-axis direction. Thus, the semiconductor wafer 54 on the chuck member 82 is cut along the streets 56 arranged in the lattice pattern. The mounting tape 52 interposed between the frame 50 and the semiconductor wafer 54 is not cut, so that the frame 50, the mounting tape 52, and the diced semiconductor wafer 54 are maintained integrally even after cutting of the semiconductor wafer 54.

Then, the chuck means 68 is returned to the chucking zone B. The second transport means 150 is lowered, and its attraction instruments 184 are brought into intimate contact with the frame 50 of the workpiece 46. The attraction instruments 184 are brought into communication with the suction source, and the workpiece 46 is attracted to the attraction instruments 184. At the same time, the chuck member 82 is cut off from the suction source to terminate the attraction of the semiconductor wafer 54 to the chuck member 82. The movable grip pieces 86 of the pair of grip mechanisms 84 provided in the chuck member 82 are returned to the non-gripping position to terminate the gripping of the frame 50. Then, the second transport means 150 is somewhat moved upward, and then moved in the Y-axis direction to move the workpiece 46 as far as the cleaning zone C. Then, the second transport means 150 is lowered, whereby the workpiece 46 attracted to the attraction instruments 184 is placed on the chuck member 102 of the cleaning means 90. The chuck member 102 is brought into communication with the suction source to attract the workpiece 46 onto the chuck member 102. At the same time, the attraction instruments 184 of the second transport means 150 are cut off from the suction source to release the workpiece 46 from the attraction instruments 184. In the cleaning zone C, the chuck member 102 having the workpiece 46 attracted thereto is brought into communication with the suction source, whereby the semiconductor wafer 54 is attracted onto the chuck member 102. The movable grip pieces 106 of the grip mechanisms 104 provided in the chuck member 102 are brought to the gripping position to grip the frame 50. Then, the elevating platform 98 is lowered, whereupon the chuck member 102 having the workpiece 46 attracted thereto is lowered to a required position. The cleaning liquid, which may be pure water, is jetted against the workpiece 46 from the jet nozzle (not shown). Simultaneously, the chuck member 102 is rotated at a speed of about 600 rpm to clean the workpiece 46 having deposits of swarf formed by cutting. Then, jetting of the cleaning liquid from the jet nozzle is stopped, and the chuck member 102 is rotated at a speed of about 3,000 rpm to spin dry the workpiece 46.

Upon completion of cleaning, the elevating platform 98 is raised to raise the chuck member 102. The chuck member 102 is cut off from the suction source to terminate the attraction of the semiconductor wafer 54. The movable grip pieces 106 of the grip mechanisms 104 are returned to the non-gripping position to terminate the gripping of the frame 50. Then, the attraction instruments 184 of the second transport means 150 are brought into communication with the suction source to attract the workpiece 46 to the attraction instruments 184. Then, the attraction instruments 184 of the second transport means 150 are lifted to a required height, and moved in the Y-axis direction up to the chucking zone B. Then, the attraction instruments 184 of the second transport means 150 are somewhat lowered to place the workpiece 46 across the pair of support members 66 of the temporary support means 64 located at the operating position indicated by the two-dot chain lines in FIG. 2. Then, the attraction instruments 184 are cut off from the suction source to release the workpiece 46 from the attraction instruments 184. Then, the attraction instruments 184 are raised.

When the workpiece 46, which has been cut and cleaned in the above-described manner, is placed on the temporary support means 64, the first transport means 148 is somewhat moved toward the chucking zone B, and the grip means 168 of the first transport means 148 is actuated to grip one edge portion of the frame 50 in the workpiece 46 placed on the temporary support means 64. Then, the first transport means 148 is moved toward the cassette placing zone A, whereby the workpiece 46 is inserted into the cassette 48. Then, the grip means 168 of the first transport means 148 is released from the workpiece 46, and the first transport means 148 is returned to the wait position shown in FIG. 2.

A next workpiece 46 to be cut, which has been accommodated in the cassette 48, is delivered from the cassette 48 onto the temporary support means 64 while the preceding workpiece 46 is being cleaned in the cleaning zone C. Then, the succeeding workpiece 46 is chucked onto the chuck member 82 of the chuck means 68. After required alignment, this workpiece 46 is transported to the cutting zone D, where cutting by the first cutting means 112a and the second cutting means 112b can be initiated.

With reference to FIG. 1 along with FIG. 2, repeated cutting of the semiconductor wafer 54 by the first cutting means 112a and the second cutting means 112b results in wear of the cutting blade of the first cutting means 112a and the cutting blade 142b of the second cutting means 112b, thus requiring replacement. In this case, the open/close door 6 of the housing 2 is pivoted upward about the hinge means 14 as the pivot center to expose the upper half central region in the front of the housing 2. By so doing, sufficiently easy access can be obtained to the cutting blade located in the cutting zone D from the front of the housing 2 through the chucking zone B, making it possible to perform an operation for replacement of the cutting blade easily and promptly. Since the operation for replacing the cutting blade can be carried out from the front of the housing 2, there is no need to secure a space for entry of the operator in the opposite sides or the rear of the housing 2. Hence, the required space for installation of the cutting machine can be made sufficiently small.

The preferred embodiments of the cutting machine constructed in accordance with the present invention have been described in detail with reference to the accompanying drawings. However, it is to be understood that the present invention is not restricted to these embodiments, but various changes and modifications may be made without departing from the spirit and scope of the invention. In the illustrated embodiments, for example, the cassette placing zone A is disposed to the right of the chucking zone B, and the cleaning zone C is disposed to the left of the chucking zone B, when viewed from the front. If desired, however, the cassette placing zone A can be disposed to the left of the chucking zone B, and the cleaning zone C can be disposed to the right of the chucking zone B, when viewed from the front. In the illustrated embodiments, moreover, the second transport means 150 is used to transport the workpiece 46, which has been cut but not cleaned, from the chucking zone B to the cleaning zone C. The second transport means 150 is also used to transport the cleaned workpiece 46 from the cleaning zone C to the chucking zone B. To rule out the possibility that the workpiece 46 after cleaning will be contaminated by the transport means, however, it is permissible, if desired, to dispose third transport means for transporting the cleaned workpiece 46 from the cleaning zone C to the chucking zone B.

What we claim is:

1. A cutting machine comprising:
   a housing having an operating panel disposed on a front surface of a front half portion of the housing; and wherein
   a chucking zone located in a widthwise center, a cassette placing zone located on one side of the chucking zone, and a cleaning zone located on an opposite side of the chucking zone are arranged in the front half portion of the housing, while a cutting zone located in the widthwise center is arranged in a rear half portion of the housing;
   cassette supporting means is disposed in the cassette placing zone, and cleaning means is disposed in the cleaning zone;
   chuck means is disposed so as to be movable in a fore-and-aft direction between the chucking zone and the cutting zone; and
   first cutting means and second cutting means are disposed in the rear half portion of the housing, the first cutting means has a first rotating shaft and a first cutting blade mounted on the first rotating shaft, the second cutting means has a second rotating shaft and a second cutting blade mounted on the second rotating shaft, the first rotating shaft and the second rotating shaft extend straightly in a width direction in the rear half portion of the housing, and the first cutting blade and the second cutting blade are mounted on a widthwise inner end of the first rotating shaft and a widthwise inner end of the second rotating shaft, respectively, and located opposite each other; and whereby
   when a cassette accommodating a plurality of workpieces is placed on the cassette supporting means, the workpieces accommodated in the cassette are sequentially delivered to the chucking zone, the delivered workpiece is chucked onto the chuck means in the chucking zone, and conveyed to the cutting zone together with the chuck means, and the workpiece on the chuck means is cut by the first cutting blade and the second cutting blade in the cutting zone, then returned to the chucking zone together with the chuck means, transported from the chucking zone to the cleaning zone, cleaned in the cleaning zone, then transported to the chucking zone, and brought into the cassette.

2. The cutting machine of claim 1, wherein temporary support means is disposed in the chucking zone, and the workpiece delivered from the cassette to the chucking zone is first placed on the temporary support means, then transported from a site on the temporary support means to a site on the chuck means, cut, cleaned, and transported from the cleaning zone to the chucking zone, whereafter the workpiece is placed onto the temporary support means, and brought into the cassette.

3. The cutting machine of claim 2, wherein the temporary support means is composed of a pair of support members, and the pair of support members are free to move between an operating position, where the support members are located at a predetermined spacing relative to each other and the workpiece is placed across the support members, and a non-operating position where the support members are moved from the operating position away from each other to allow the workpiece to descend through a gap therebetween, and when the chuck means is located in the chucking zone, the chuck means is positioned below the temporary support means.

4. The cutting machine of claim 1, wherein the workpiece is a semiconductor wafer, and the first cutting blade and the second cutting blade are shaped as disks containing diamond grains and dice the semiconductor wafer.

* * * * *